US 11,455,064 B2

(12) United States Patent
Xie (10) Patent No.: US 11,455,064 B2
(45) Date of Patent: Sep. 27, 2022

(54) TOUCH STRUCTURE, TOUCH DISPLAY PANEL AND TOUCH DISPLAY DEVICE

(71) Applicant: Wuhan China Star Optoelectronics Semiconductor Display Technology Co., Ltd., Wuhan (CN)

(72) Inventor: Ming Xie, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/615,856

(22) PCT Filed: Sep. 20, 2019

(86) PCT No.: PCT/CN2019/106997
§ 371 (c)(1),
(2) Date: Nov. 22, 2019

(87) PCT Pub. No.: WO2021/027020
PCT Pub. Date: Feb. 18, 2021

(65) Prior Publication Data
US 2022/0164063 A1      May 26, 2022

(30) Foreign Application Priority Data
Aug. 12, 2019   (CN) .......................... 201910740829.8

(51) Int. Cl.
*G06F 3/044*       (2006.01)
*H01L 27/32*      (2006.01)
*H01L 51/52*      (2006.01)

(52) U.S. Cl.
CPC .......... *G06F 3/0445* (2019.05); *G06F 3/0446* (2019.05); *H01L 27/323* (2013.01);
(Continued)

(58) Field of Classification Search
CPC .... G06F 3/0446; G06F 3/0443; G06F 3/0412; G06F 3/044; G06F 3/041; G06F 3/0488; G06F 3/017; G06F 3/016; G06F 3/0445; G06F 3/0448; G06F 3/03547; G06F 2203/0411; G06F 2203/04103; G06F 2203/04112; G06F 2203/04102; H01L 27/323; H01L 23/528; H01L 23/5226; H01L 24/19; H01L 25/0657; H01L 2225/06548; H01L 2225/06555
See application file for complete search history.

(56) References Cited

U.S. PATENT DOCUMENTS

2014/0320761 A1    10/2014 Misaki
2015/0277483 A1*  10/2015 Lee ........................... G06F 1/16
345/174
(Continued)

*Primary Examiner* — Dong Hui Liang
(74) *Attorney, Agent, or Firm* — Nathan & Associates; Menachem Nathan (57) ABSTRACT

The present invention provides a touch structure, a touch display panel, and a touch display device. The touch structure includes an insulating layer, a first metal layer, a passivation layer, a second metal layer, and a third metal layer. The passivation layer and the first metal layer are disposed on the insulating layer, wherein a first recess is opened in the passivation layer corresponding to the first electrode; and the second metal layers partially fills the first recess of the passivation layer.

8 Claims, 4 Drawing Sheets

(52) U.S. Cl.
CPC ...... *H01L 27/3244* (2013.01); *H01L 51/5281* (2013.01); *G06F 2203/04111* (2013.01); *G06F 2203/04112* (2013.01)

(56) References Cited

U.S. PATENT DOCUMENTS

| | | | |
|---|---|---|---|
| 2016/0202831 A1* | 7/2016 | Kim | G06F 3/0446 |
| | | | 345/173 |
| 2016/0306460 A1* | 10/2016 | Lee | H01L 27/322 |
| 2019/0064959 A1* | 2/2019 | Zheng | G06F 3/0446 |
| 2020/0106031 A1* | 4/2020 | Zhang | H01L 27/3244 |

* cited by examiner

TOUCH STRUCTURE, TOUCH DISPLAY PANEL AND TOUCH DISPLAY DEVICE

BACKGROUND OF INVENTION

Field of Invention

The present invention relates to a field of display technologies, and in particular, to a touch structure, a touch display panel, and a touch display device.

Description of Prior Art

With the rapid development of display technology, active matrix organic light-emitting diode (AMOLED) flexible displays have attracted great attention, including full screen mobile phones, and bendable mobile phones, and even foldable mobile phones of fixed curve shape which will be widely used in the future market. Flexible display technology can change a shape of the display device and increase flexibility and diversity of display, so it is expected to bring about major changes in the field of display technologies.

Metal mesh technology uses a metal material such as silver or copper to be grown on a plastic film such as glass or polyethylene terephthalate (PET) to form a conductive metal mesh pattern. The metal grid has a lower resistivity than ITO, usually less than 10 $\Omega$/m, and can realize the roll-to-roll production. In addition, the metal mesh has good bending resistance and thus can be used for flexible folding devices. Y-OCTA (Samsung's marketing term is YOUM On-Cell touch AMOLED) technology is applied to flexible touch display technology. This design using metal mesh to directly make touch wires on thin film encapsulation (TFE), greatly reducing thicknesses of the original external touch electrode layer and the optical clear adhesive (OCA), such that the touch display panel is thinner and more favorable for bending. The touch display panel uses a carbon nanotube (CNT) process to connect an upper layer and a lower layer of metal to form a mesh for flexible touch, but the CNT process makes the intermetallic structure fold. During a flexible bending testing, it was found that the metal wire in the touch display panel are prone to breakage and cracks, resulting in an increased impedance of the touch structure. In severe cases, the breakage even leads to a disconnection, failing to transmit the signal, thus impacting operation.

In order to solve the above problems, the inventors of this application conducted a study on a mechanical reliability of metal wire, and found that the mechanical reliability of metal wire has obvious size dependence and shape dependence. The same materials were tested by finite element simulations, and finally results tended to be consistent, such that standard rationality of the metal wire bending test was effectively verified.

Figure 1:
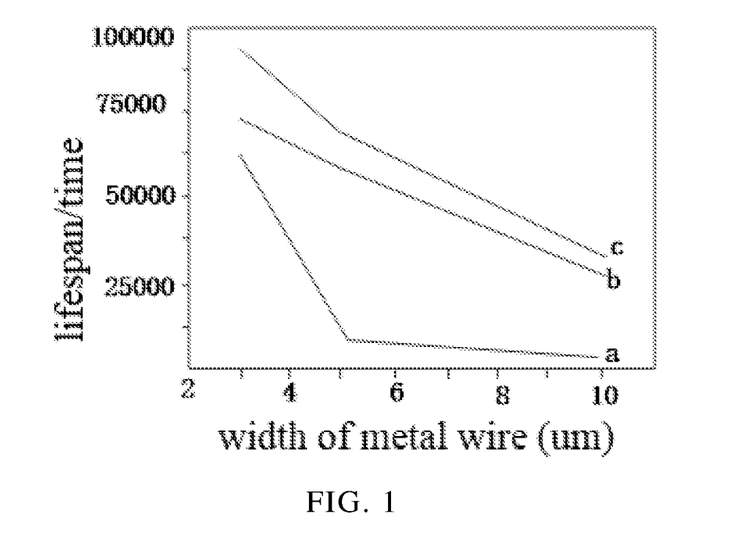
FIG. 1 is a schematic diagram of a service lifespan analysis of a metal wire in the prior art.

As shown in FIG. 1, it can be seen that a lifespan of the metal wire is shortened as a width of the metal wire increases, regardless of shapes of the metal wire whether it has a zigzag shape a (rectangular waveform), a straight-line shape b, or a sinusoidal waveform shape c. However, relatively speaking, the metal wire of the sinusoidal waveform shape c has a longest lifespan. As for a testing surface, when the line widths of the zigzag shape a, the straight-line shape b, and the sinusoidal waveform shape c are simultaneously 3 um, the metal wire of the sinusoidal waveform shape c has the longest lifespan.

However, in the touch structure of the prior art, the metal wire is in a zigzag shape, and during the flexible bending experiment, the metal wire is found to be easily broken.

Figure 2:
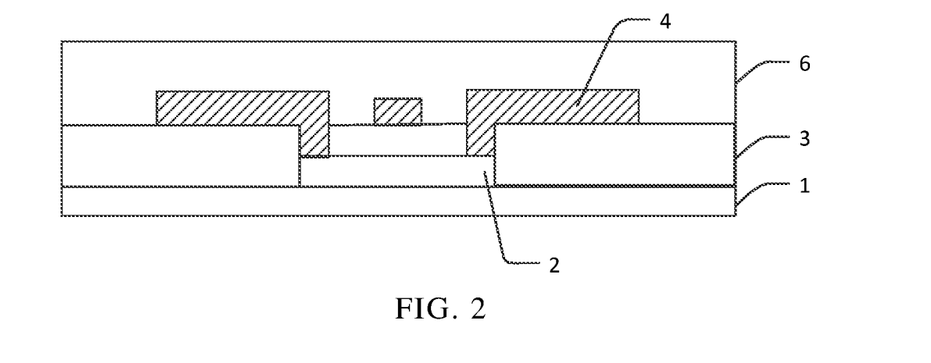
FIG. 2 is a schematic structural diagram of a touch structure according to the prior art.

As shown in FIG. 2, in the touch structure of the prior art, a patterned first metal layer 2 is first formed on the insulating layer 1; a passivation is formed on an upper surface of the first metal layer 2 and the insulating layer 1, the passivation layer 3 having a CNT via hole; a patterned second metal layer 4 is formed on an upper surface of the passivation layer 3, the second metal layer 4 filling the CNT via hole; and a protective filling layer 6 is fabricated on an upper surface of the second metal layer 4. The second metal layer 4 includes a first electrode electrically connected to the first metal layer 2. As shown in FIG. 2, the second metal layer is connected to the first metal layer through the CNT via hole, and the metal wire formed finally has a zigzag shape, which is prone to breakage, thus impacting bending or folding performance of the touch display panel.

SUMMARY OF INVENTION

An object of the present invention is to provide a touch structure, a touch display panel, and a touch display device, so as to solve the problem that the touch structure in the prior art is prone to metal wire breakage during bending or folding, resulting in increased impedance of the control structure, impacting signal transmission.

To achieve the above object, the present invention provides a touch structure including an insulating layer; a first metal layer patterned and disposed on the insulating layer, the first metal layer including: a plurality of rows of first electrodes arranged in a first direction and a plurality of rows of second electrodes arranged in a second direction, wherein the second electrodes in a same row are electrically connected in sequence by a metal wire, the metal wire is formed by patterning the first metal layer, and the first direction is different from the second direction; a passivation layer disposed on the first metal layer, wherein a first recess is opened in the passivation layer corresponding to the first electrode; second metal layers partially filling the first recess of the passivation layer, and having an end electrically connected to the first electrode correspondingly; a third metal layer disposed on the passivation layer, and having opposite ends electrically connected to adjacent ones of the second metal layers, respectively.

Further, the first recess forms a second recess after partially filling the second metal layers, and a bottom surface of the second recess is in contact with the first metal layer.

Further, a first inclined surface of the second recess forms an angle of 10 to 30 degrees with an upper surface of the first metal layer, and the first inclined surface is formed by the passivation layer.

Further, a second inclined surface of the second recess forms an angle of 10 to 30 degrees with an upper surface of the first metal layer, and the second inclined surface is formed by the second metal layer.

Further, the second recess has a cross-sectional shape of an inverted trapezoid.

Further, the touch structure further includes: a protective planarization layer disposed on the passivation layer and the third metal layer, and filling the second recess.

Further, the second metal layer has a cross section of a right angle trapezoid; the second metal layer has a thickness of 0.3 um to 0.4 um; and the second metal layer has a width of 1.5 um to 3 um.

To achieve the above object, the present invention further provides a touch display panel including the touch structure described above.

Further, the touch display panel includes: a substrate; a thin film transistor layer disposed on the substrate; a light-emitting layer disposed on the thin film transistor layer; a thin film encapsulation layer disposed on the light-emitting layer, wherein the touch structure is disposed on the thin film encapsulation layer; and a polarizing layer disposed on the touch structure.

To achieve the above object, the present invention further provides a touch display device, including the touch display panel described above.

The technical effect of the present invention is to provide a touch structure, a touch display panel, and a touch display device. The touch structure has an inverted metal grid structure, and a recess (second recess) is disposed at a junction between the passivation layer and the second metal layer and has a first inclined surface and a second inclined surface. On the one hand, the contact area between the organic material and the metal layer in the protective filling layer can be increased to prevent the touch display panel and the touch display device from generating cracks when it is bent or folded. On the other hand, the first touch wire is arranged in a sinusoidal waveform shape, which can alleviate the stress received when the first touch wire is bent or folded, thereby prolonging the lifespan of the metal wire, optimizing the design of the touch display panel and the touch display folding screen, thus improving the quality of the touch display panel and the touch display device.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Elements in the drawings are designated by reference numerals listed below.

1 insulating layer; 2 first metal layer;
3 passivation layer; 4 second metal layer;
5 third metal layer; 6 protective filling layer;
100 first electrode; 200 second electrode;
101 electrode bridge; 201 metal wire;
301 first recess; 302 second recess;
303 first angle; 304 second angle;
3011 first inclined surface; 3021 second inclined surface;
10 substrate; 20 thin film transistor layer; 30 light-emitting layer;
40 thin film encapsulation layer; 50 touch structure; 60 polarizing layer;
111 via hole; 112 second metal film layer.

DETAILED DESCRIPTION OF PREFERRED EMBODIMENTS

The preferred embodiments of the present invention are described below with reference to the accompanying drawings, which are used to exemplify the embodiments of the present invention, which can fully describe the technical contents of the present invention to make the technical content of the present invention clearer and easy to understand. However, the present invention may be embodied in many different forms of embodiments, and the scope of the present invention is not limited to the embodiments set forth herein.

Figure 3:
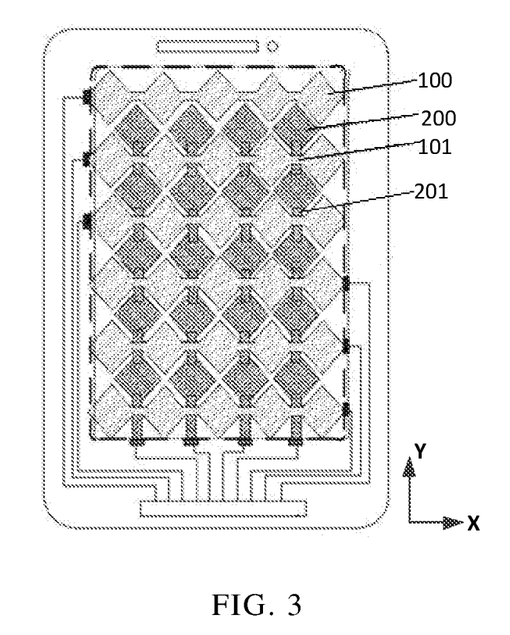
FIG. 3 is a schematic plan structural diagram showing a touch structure according to an embodiment of the present disclosure.

As shown in FIG. 3, this embodiment provides a touch structure including a plurality of first electrodes 100 arranged along a first direction X, and a plurality of second electrodes 200 arranged along a first direction Y. The first electrode 100 and the second electrode 200 are insulated from each other. In the first electrodes 100 arranged along the first direction, the first electrodes 100 on the same straight line are sequentially electrically connected through an electrode bridge 101 to form a first touch wire; and in the second electrodes 200 arranged in the second direction, the second electrodes 200 on the same straight line are electrically connected in sequence through a metal wire 201 of the same layer to form a second touch wire. For convenience of description, the arrangement parallel to the first direction is defined as being in a row direction, and the arrangement parallel to the second direction is defined as being in a column direction.

Figure 4:
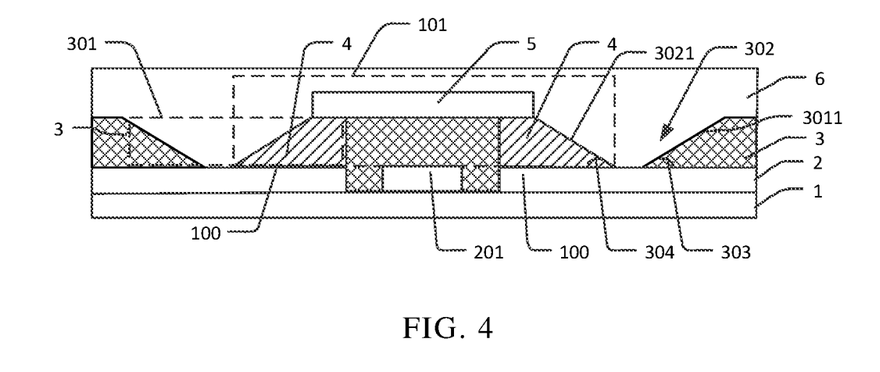
FIG. 4 is a schematic structural diagram of a touch structure according to an embodiment of the present disclosure.

As shown in FIG. 4, the touch structure includes an insulating layer 1, a first metal layer 2, a passivation layer 3, a second metal layer 4, a third metal layer 5, and a protective filling layer 6.

The first metal layer 2 is patterned and disposed on the insulating layer 1, and the first metal layer 2 includes a plurality of rows of first electrodes 100 arranged in a first direction and a plurality of rows of second electrodes 200 arranged in a second direction, wherein the second electrodes 200 in a same row are electrically connected in sequence by a metal wire 201, and the metal wire 201 preferably has a line width of 1.8 to 3 um, and has good electrical conductivity and flexibility.

The first direction is different from the second direction, and the second direction is perpendicular to the first direction. In other words, the first electrodes 100 are arranged in the first direction and have a mesh shape, the adjacent first electrodes 100 being electrically connected to each other in the first direction to form the first touch wires; and the second electrodes 200 are along the second direction crossing the first direction and have the mesh shape; the adjacent second electrodes 200 being electrically connected to each other along the second direction to form the second touch wire. The first touch wire and the second touch wire are insulated from each other by the passivation layer 3 to form a bridge structure. Material of the first metal layer 2 may be, but not limited to, a metal material having a good bending property such as Ti/Al/Ti, AgNW, etc. In this embodiment, when the material of the first metal layer 2 is Ti/Al/Ti, that is, the first metal layer 2 is a structure of titanium-aluminum-titanium, and a thickness of the titanium layer is preferably 0.025 um to 0.035 um, and a thickness of the aluminum layer is preferably from 0.11 um to 0.16 um, so that the first metal layer 2 has superior electrical conductivity and flexibility.

The passivation layer 3 is disposed on an upper surface of the first metal layer 2, and a first recess 301 is opened in the passivation layer corresponding to the first electrode, as shown in FIG. 4. Specifically, the first recess 301 is opened on the upper surface of the first electrode 100 and close to the passivation layer 3 on a side of the metal wire 201. Material of the passivation layer 3 is an inorganic material, which may be, but not limited to, a flexible material such as SiN, SiON, etc.

The second metal layer 4 partially fills the first recess 301 of the passivation layer 3, and has one end electrically connected to the first electrode 100 correspondingly, and the other end electrically connected to the third metal layer 5 to form the first touch wire. Specifically, the second metal layer 4 fills a side of the first recess 301 close to the metal wire 201, and the second metal layer 4 has a cross section of a right angle trapezoid with a thickness of 0.3 um to 0.4 um and a width of 1.5 um to 3 um, and has excellent electrical conductivity and flexibility. The first recess 301 forms a second recess 302 after partially filling the second metal layer 4, and a bottom surface of the second recess 302 is in contact with the first metal layer 2. An angle formed by the first inclined surface 3011 of the second recess 302 and the upper surface of the first metal layer 2 is a first angle 303 of 10 to 30 degrees, and the first inclined surface 3011 is an inclined surface formed by the passivation layer 3, such that a stress gap between adjacent sub-passivation layers can prevent the entire passivation layer 3 from being broken. The cross-sectional shape of the second recess 302 is an inverted trapezoid, and the angle formed by the second inclined surface 3021 of the second recess 302 and the upper surface of the first metal layer 2 is a second angle 304 of 10 to 30 degrees. The second inclined surface 3021 is an inclined surface formed by the second metal layer 4. In this embodiment, material of the second metal layer 4 may be, but not limited to, a metal material having a good bending property such as Ti/Al/Ti, AgNW, etc. In this embodiment, when the material of the second metal layer 4 is Ti/Al/Ti, that is, the second metal layer 4 is a structure of titanium-aluminum-titanium, and a thickness of the titanium layer is preferably 0.045 um to 0.055 um, and a thickness of the aluminum layer is preferably from 0.25 um to 0.35 um, so that the second metal layer 4 has superior electrical conductivity and flexibility.

The third metal layer 5 is disposed on the passivation layer 3, and has opposite ends electrically connected to adjacent ones of the second metal layers 4, respectively, to form the electrode bridge 101. Material of the third metal layer 5 may be, but not limited to, a metal material having a good bending property such as Ti/Al/Ti, AgNW, etc.

The protective filling layer 6 is disposed on the upper surfaces of the passivation layer 3 and the third metal layer 5, and fills the second recess 302. Material of the protective filling layer 6 includes an organic material having a thickness of 1.8 um to 2.5 um and having good flexibility. The organic material may be, but not limited to, an organic material such as polymethyl methacrylate (PMMA), an epoxy resin, a phenol resin, an acrylate resin, a methacrylic resin, and the like.

Compared with the prior art, in which a touch structure of the prior art is a metal mesh structure, the touch structure of the embodiment is an inverted metal mesh structure, and a second recess 301 is disposed at a junction between the passivation layer 3 and the second metal layer 4 and has a first inclined surface 3011 and a second inclined surface 3021. On the one hand, the contact area between the metal layer and the protective filling layer can be increased to improve the bending or folding performance of the touch structure. On the other hand, the second recess may divide the entire passivation layer 3 into a plurality of sub-passivation layers, such that when the touch structure is bent or folded to cause crack in a certain sub-passivation layer, the crack does not extend to other sub-passivation layers, thereby limiting propagation of cracks and improving the overall performance of the touch structure. Referring to FIG. 3 in conjunction with FIG. 4, the first electrodes 100 are arranged in the first direction, and the first electrodes 100 on the same straight line are electrically connected through the electrode bridges 101 in sequence to form the first touch wire. When the contact area between the protective filling layer and the metal layer is increased, the stress to which the first touch wire is subjected during bending or folding may be alleviated, thereby reducing the risk of disconnection of the first touch wire and reducing the impedance of the touch structure, thus improving the bending or folding performance of the first touch wire. In addition, the first touch wires are arranged in a sinusoidal waveform shape, and the stress received by the first touch wire when the first touch wire is bent or folded does not act on a same position, preventing the first touch wires from being broken, further alleviating the stress received by the first touch wire, thus extending the lifespan of the metal wire.

Further, in this embodiment, the second metal layer 4 has a cross section of a right-angled trapezoid having a thickness of 0.295 um to 0.405 um, preferably 0.34 um, 0.36 um, and 0.38 um and having a width of 1.5 um to 3 um. However, the lifespan analysis of a metal wire in the prior art shows that the lifespan of the metal wire having a sinusoidal shape is the longest. Referring to FIG. 1, when the line widths of the zigzag shape a, the straight-line shape b, and the sinusoidal waveform shape c are simultaneously 3 um, the metal wire of the sinusoidal waveform shape c has the longest lifespan. Therefore, in this embodiment, the width of one end of the second metal layer 4 connected to the first electrode 100 is 2.4-3 um, and the width of the other end of the second metal layer 4 connected to the third metal layer 5 is 1.5 um-1.8 um, extending the lifespan of the first touch wire, and improving the bending or folding performance of the first touch wire.

It should be noted that, in this embodiment, the second recess 301 is disposed at the junction of the passivation layer 3 and the second metal layer 4, and the second recess 301 includes a first inclined surface 3011 and a second inclined surface 3021, and the first angle formed by the inclined surface 3011 and the upper surface of the first metal layer 2 is the first angle 303, and the angle formed by the second inclined surface 3021 and the upper surface of the first metal layer 2 is the second angle 304. The first angle 303 and the second angle 304 both range from 10 to 30 degrees, such that the contact area between the protective filling layer and the metal layer may be increased, the first touch wire may be arranged in a sinusoidal waveform shape, and the stress received by the first touch wire when the first touch wire is bent or folded does not act on a same position, preventing the first touch wires from being broken, further alleviating the stress received by the first touch wire, thus extending the lifespan of the metal wire.

Figure 5:
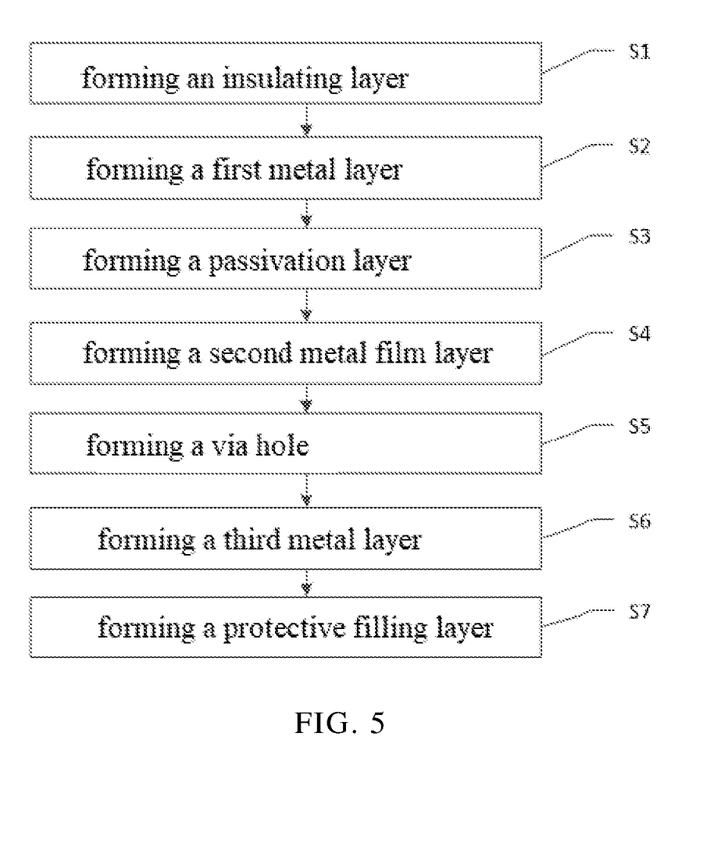
FIG. 5 is a flowchart of a method of fabricating a touch structure according to an embodiment of the present disclosure.

As shown in FIG. 5, this embodiment further provides a method of fabricating a touch structure, including the following steps S1 to S7.

Step S1 forming an insulating layer. Material of the insulating layer is an inorganic material, and the inorganic material may be, but not limited to, SiN, SiON, etc., and has a thickness of 0.15 um to 0.25 um.

Step S2 forming a first metal layer, including depositing a metal material on an upper surface of the insulating layer to form a first metal film layer, and patterning the first metal film layer by physical vapor deposition to form a first metal layer. The first metal layer includes a plurality of rows of first electrodes arranged in a first direction and a plurality of rows of second electrodes arranged in a second direction, wherein the second electrodes in a same row are electrically connected in sequence by a metal wire, the metal wire are formed by patterning the first metal layer, and the metal wire has a width of 1.5 um to 3 um.

The first direction is different from the second direction, and the second direction is perpendicular to the first direction. In other words, the first electrodes are arranged in the first direction and have a mesh shape, the adjacent first electrodes being electrically connected to each other in the first direction to form the first touch wires; and the second electrodes are along the second direction crossing the first direction and have the mesh shape; the adjacent second electrodes being electrically connected to each other along the second direction to form the second touch wire. Material of the first metal layer may be, but not limited to, a metal material having a good bending property such as Ti/Al/Ti, AgNW, etc. In this embodiment, when the material of the first metal layer is Ti/Al/Ti, that is, the first metal layer 2 is a structure of titanium-aluminum-titanium, and a thickness of the titanium layer is preferably 0.025 um to 0.035 um, and a thickness of the aluminum layer is preferably from 0.11 um to 0.16 um, so that the first metal layer 2 has superior electrical conductivity and flexibility.

Step S3 forming a passivation layer, including forming a passivation layer on an upper surface of the first metal layer, wherein the passivation layer is provided with a via hole. An inorganic material of the passivation layer may be, but not limited to, a flexible material such as SiN, SiON, etc. The first touch wire and the second touch wire are insulated from each other by the passivation layer to form a bridge structure.

Step S4 forming a second metal film layer, including forming a second metal film layer on the upper surface of the first metal layer using a mask.

Figure 6:
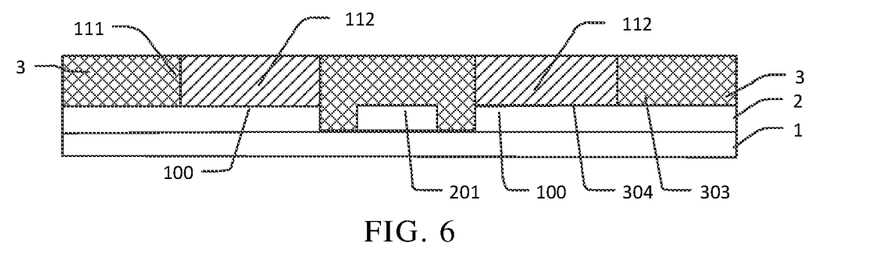
FIG. 6 is a schematic structural diagram of a second metal film layer according to an embodiment of the present disclosure.

As shown in FIG. 6, a metal material is filled in the via hole 111 to form a second metal film layer 112, and the second metal film layer 112 is electrically connected to the first electrode 100.

Step S5 dry etching, including dry-etching the passivation layer and the second metal film layer by physical vapor deposition to form a second metal layer.

Figure 7:
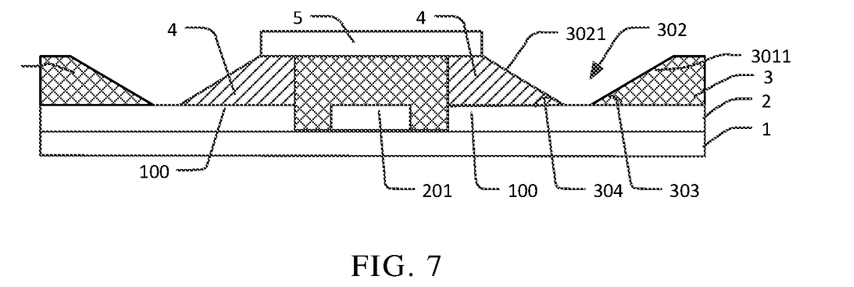
FIG. 7 is a schematic structural diagram of a second recess according to an embodiment of the present disclosure.

As shown in FIG. 7, the passivation layer 3 and the second metal film layer 112 are dry-etched so that the passivation layer 3 and the second metal layer 4 are provided with a recess, and the recess is the second recess 302 described above. The second recess 302 has a cross-sectional shape of an inverted trapezoid, and includes a first inclined surface 3011 and a second inclined surface 3021. The first inclined surface 3011 is an inclined surface formed by the passivation layer 3, and the second inclined surface 3021 is an inclined surface formed by the second metal layer 4. The angle formed by the first inclined surface 3011 and the upper surface of the first metal layer 2 is a first angle 303, and the angle formed by the second inclined surface 3021 and the upper surface of the first metal layer 3 is a second angle 304. The first angle 303 and the second angle 304 both range from 10 to 30 degrees. Material of the second metal layer 4 may be, but not limited to, a metal material having a good bending property such as Ti/Al/Ti, AgNW, etc. In this embodiment, when the material of the second metal layer 4 is Ti/Al/Ti, that is, the second metal layer 4 is a structure of titanium-aluminum-titanium, and a thickness of the titanium layer is preferably 0.045 um to 0.055 um, and a thickness of the aluminum layer is preferably from 0.25 um to 0.35 um, so that the second metal layer 4 has superior electrical conductivity and flexibility.

Step S6 forming a third metal layer, including forming a patterned third metal layer 5 on upper surfaces of the adjacent ones of the second metal layers 4 by physical vapor deposition, as shown in FIG. 7.

Specifically, opposite ends of the third metal layer are electrically connected to adjacent ones of the second metal layers respectively, to form an electrode bridge. The two second metal layers at opposite ends of the electrode bridge each include a first electrode, and the electrode bridge is used to electrically connect the adjacent ones of the first electrodes. Material of the third metal layer may be, but not limited to, a metal material having better bending properties such as Ti/Al/Ti, AgNW, etc.

Step S7 forming a protective filling layer, including depositing an organic material on surfaces of the passivation layer and the third metal layer to form a protective filling layer and filling the recess, that is, fill the second recess, as shown in FIG. 4. The protective filling layer has a thickness of 1.8 um to 2.5 um and has good flexibility. The organic material may be, but not limited to, polymethyl methacrylate (PMMA), an epoxy resin, a phenol resin, an acrylate resin, a methacrylic resin, etc.

In this embodiment, a recess is formed at the junction of the passivation layer and the second metal layer, and the recess includes a first inclined surface and a second inclined surface. On the one hand, the contact area between the metal layer and the protective filling layer can be increased to improve the bending or folding performance of the touch structure. On the other hand, the second recess may divide the entire passivation layer 3 into a plurality of sub-passivation layers, such that when the touch structure is bent or folded to cause crack in a certain sub-passivation layer, the crack does not extend to other sub-passivation layers, thereby limiting propagation of cracks and improving the overall performance of the touch structure.

Further, the first electrodes are arranged in the first direction, and the first electrodes on the same straight line are electrically connected through the electrode bridges in sequence to form the first touch wire. When the contact area between the protective filling layer and the metal layer is increased, the stress to which the first touch wire is subjected during bending or folding may be alleviated, thereby reducing the risk of disconnection of the first touch wire and reducing the impedance of the touch structure, thus improving the bending or folding performance of the first touch wire. In addition, the first touch wires are arranged in a sinusoidal waveform shape, and the stress received by the first touch wire when the first touch wire is bent or folded does not act on a same position, preventing the first touch wires from being broken, further alleviating the stress received by the first touch wire, thus extending the lifespan of the metal wire.

Figure 8:
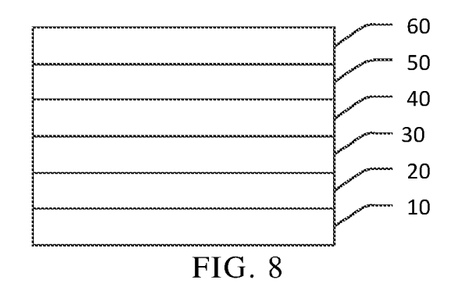
FIG. 8 is a schematic structural diagram of a touch display panel according to an embodiment of the present disclosure.

As shown in FIG. 8, this embodiment further provides a touch display panel with good flexibility, which can be bent or folded. The touch display panel includes a substrate 10, a thin film transistor layer 20, a light-emitting layer 30, a thin film encapsulation layer 40, a touch structure 50 as described above, and a polarizing layer 60. The thin film transistor layer 20, the light-emitting layer 30, the thin film encapsulation layer 40, the touch structure 50, and the polarizing layer 60 are sequentially disposed on an upper surface of the substrate 10.

The touch display panel adopts the touch structure described above. Since the touch structure is an inverted metal grid structure, and a second recess is disposed at a junction between the passivation layer and the second metal layer and has a first inclined surface and a second inclined surface. On the one hand, the contact area between the organic material and the metal layer in the protective filling layer can be increased to prevent the touch display panel and the touch display device from generating cracks when it is bent or folded. On the other hand, the first touch wire is arranged in a sinusoidal waveform shape, which can alleviate the stress received when the first touch wire is bent or folded, thereby prolonging the lifespan of the metal wire, optimizing the design of the touch display panel and the touch display folding screen, thus improving the quality of the touch display panel and the touch display device.

This embodiment further provides a touch display device, including the touch display panel described above. The touch display device uses a touch display panel to implement a touch display function, such as a smart phone, a tablet computer, or other devices for display and touch; and the touch display panel is as described above, not repeated herein for brevity.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A touch structure, comprising:
   an insulating layer;
   a first metal layer patterned and disposed on the insulating layer, the first metal layer comprising: a plurality of rows of first electrodes arranged in a first direction and a plurality of rows of second electrodes arranged in a second direction, wherein the second electrodes in a same row are electrically connected in sequence by a metal wire, the metal wire is formed by patterning the first metal layer, and the first direction is different from the second direction;
   a passivation layer disposed on the first metal layer, wherein a first recess is opened in the passivation layer corresponding to the first electrode;
   second metal layers partially filling the first recess of the passivation layer, and having an end electrically connected to the first electrode correspondingly;
   a third metal layer disposed on the passivation layer, and having opposite ends electrically connected to adjacent ones of the second metal layers, respectively,
   wherein the first recess forms a second recess after partially filling the second metal layers, and a bottom surface of the second recess is in contact with the first metal layer; and
   wherein a first inclined surface of the second recess forms an angle of 10 to 30 degrees with an upper surface of the first metal layer, and the first inclined surface is formed by the passivation layer.

2. A touch display panel, comprising the touch structure according to claim 1.

3. The touch display panel according to claim 2, comprising:
   a substrate;
   a thin film transistor layer disposed on the substrate;
   a light-emitting layer disposed on the thin film transistor layer;
   a thin film encapsulation layer disposed on the light-emitting layer, wherein the touch structure is disposed on the thin film encapsulation layer; and
   a polarizing layer disposed on the touch structure.

4. A touch display device, comprising the touch display panel according to claim 2.

5. The touch structure according to claim 1, wherein a second inclined surface of the second recess forms an angle of 10 to 30 degrees with an upper surface of the first metal layer, and the second inclined surface is formed by the second metal layer.

6. The touch structure according to claim 1, wherein the second recess has a cross-sectional shape of an inverted trapezoid.

7. The touch structure according to claim 1, further comprising:
   a protective planarization layer disposed on the passivation layer and the third metal layer, and filling the second recess.

8. The touch structure according to claim 1, wherein
   the second metal layer has a cross section of a right angle trapezoid;
   the second metal layer has a thickness of 0.3 um to 0.4 um; and
   the second metal layer has a width of 1.5 um to 3 um.

* * * * *